United States Patent [19]
Storimans

[11] 3,973,457
[45] Aug. 10, 1976

[54] FEED MECHANISM FOR COMPONENT PARTS

[75] Inventor: Franciscus Jozef A. Storimans, Stouffville, Canada

[73] Assignee: Frank Storimans Limited, Vandorf, Gormley, Canada

[22] Filed: Nov. 24, 1975

[21] Appl. No.: 634,367

[52] U.S. Cl. .................................. 83/411 R; 83/417
[51] Int. Cl.² ............................................ B26D 7/06
[58] Field of Search ........... 83/411 R, 417; 214/1 B, 214/330

[56] References Cited
UNITED STATES PATENTS

| | | | |
|---|---|---|---|
| 2,047,021 | 7/1936 | Friden | 83/411 R |
| 2,592,019 | 4/1952 | Farnett | 83/411 R |
| 3,067,644 | 12/1962 | Dearsky | 83/411 R X |
| 3,478,632 | 11/1969 | Schmermund | 83/411 R X |
| 3,701,298 | 10/1972 | Heller et al. | 83/411 R X |
| 3,768,353 | 10/1973 | Milner | 83/411 R X |

*Primary Examiner*—Frank T. Yost
*Attorney, Agent, or Firm*—Fetherstonhaugh & Co.

[57] ABSTRACT

A component feeder mechanism for feeding electronic components which are not taped together into a component lead forming machine. The feeder mechanism includes a frame having a guide track extending therethrough along which the component leads pass to enter the lead forming machine. A spacer disc is rotatably mounted on the frame and has notches at the peripheral edge thereof which move along the guide track and which serve to move the lead wires one at a time along the guide track to transfer the components from a feeder magazine to the forming machine. The components are spaced from one another a distance equal to the peripheral distance between the notches at the edge of the spacer disc. The spacer disc is driven by a transmission which serves to synchronize the rotation of the spacer disc with the forming machine. A shoulder is formed in the guide track to deflect the component leads radially outwardly from the notches in the spacer disc at the end of the transfer section of the guide track into engagement with a driven wheel of the component forming machine so that the component forming machine removes the spaced component from the frame.

7 Claims, 12 Drawing Figures

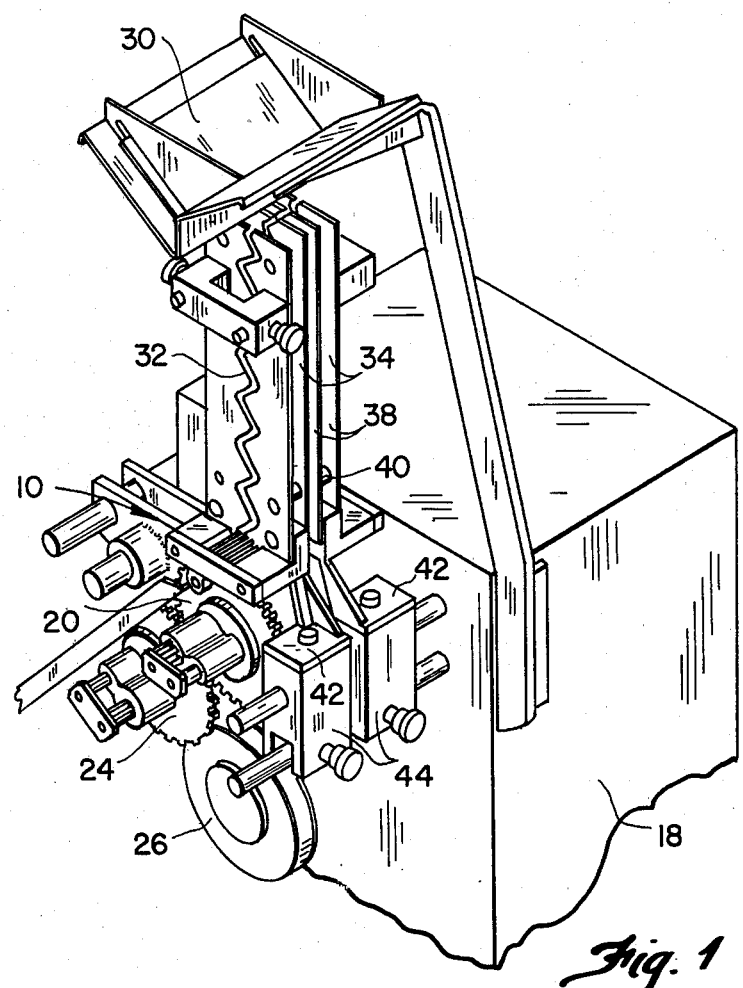
Fig. 1
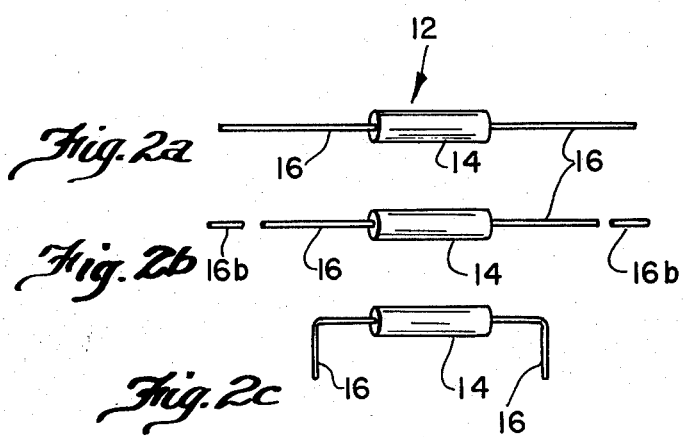
Fig. 2a
Fig. 2b
Fig. 2c

FEED MECHANISM FOR COMPONENT PARTS

FIELD OF INVENTION

This invention relates to component forming machines for forming the lead wires of electrical components. In particular, this invention relates to a bulk or card mounted component feeder mechanism for feeding components from a bulk supply of components to a forming machine.

PRIOR ART

Electronic components, such as transistors, diodes and condensers are manufactured in large quantities with standard body lengths and standard lead wire lengths projecting from opposite ends thereof. The lead wires of the components are cut and formed to various lengths and configurations for various applications. This operation is carried out in various machines commonly known as component lead forming machines. A component lead forming machine of this type is manufactured by Frank Storimans Limited, Vandorf, Gormley, Ontario, and is identified by the trade name CF-7 or CF-7V. In order to feed the electronic components to the component lead forming machine, it has been the practice to tape the components in a predetermined fixed relationship with respect to one another during the manufacture of the components. The taped components are fed to the forming machine and maintained in the required spaced relationship prior to forming by means of the tape. In an alternative feeding mechanism, the components are mounted in side-by-side relationship in a feeding card. In both of these procedures, it is necessary to fix the position of the various electronic components with respect to one another at a distance from one another equal to the pitch of the teeth of the feeder wheel of the component forming machine into which the components are fed prior to cutting and forming of the leads in the forming machine. The taping and carding operations are costly and time-consuming.

It is an object of the present invention to provide a component feeder for feeding electrical components from a bulk supply of components to a component lead forming machine without the necessity of prior taping of the components.

SUMMARY OF INVENTION

A component feeder for electrical components according to one aspect of the present invention consists of a frame having a pair of side walls spaced from one another a distance sufficient to permit the body portion of the component to pass therebetween. Guide track means extending through each of the side walls for receiving and guiding the leads of the components as they pass through the frame. Each of the guide tracks has an inside edge and an outside edge and a serially connected entry section, spacing section and exit section. A spacer disc is rotatably mounted in each side wall for rotation about its central axis with a portion of its marginal edge overlying said spacing section of the guide track. Transmission means is provided for driving said spacer disc means in a synchronized relationship with respect to its associated component forming machine. Notch means is formed in the marginal edge of said spacer disc, the notch means having a depth to overlie the spacing section of said guide track means as it passes thereover. The notch means has a forwardly directed face and a rearwardly directed face with respect to the direction of rotation of said disc. The notch is adapted to permit transfer of the lead wire from the entry section to the spacing section of the guide track when the notch is aligned with said entry section. The forwardly directed face is adapted to drive a lead wire of a component along the guide track means in response to rotation of the disc. The inside edge of said spacing section has an ejection shoulder adapted to force the lead wire out of the notch which carries it to transfer the lead wire and its associated main body portion to said exit section for engagement with a feeder wheel of said component lead forming machine or the like in a spaced relationship to a subsequently delivered component.

BRIEF DESCRIPTION OF THE DRAWINGS

FIG. 1 is a pictorial view of a feeder mechanism according to an embodiment of the present invention illustrating the component forming machine, in association with which the feeder mechanism is used, in phantom outline;

FIGS. 2a, 2b and 2c illustrate three stages in the forming operation of an electronic component;

PREFERRED EMBODIMENT

Figure 3:
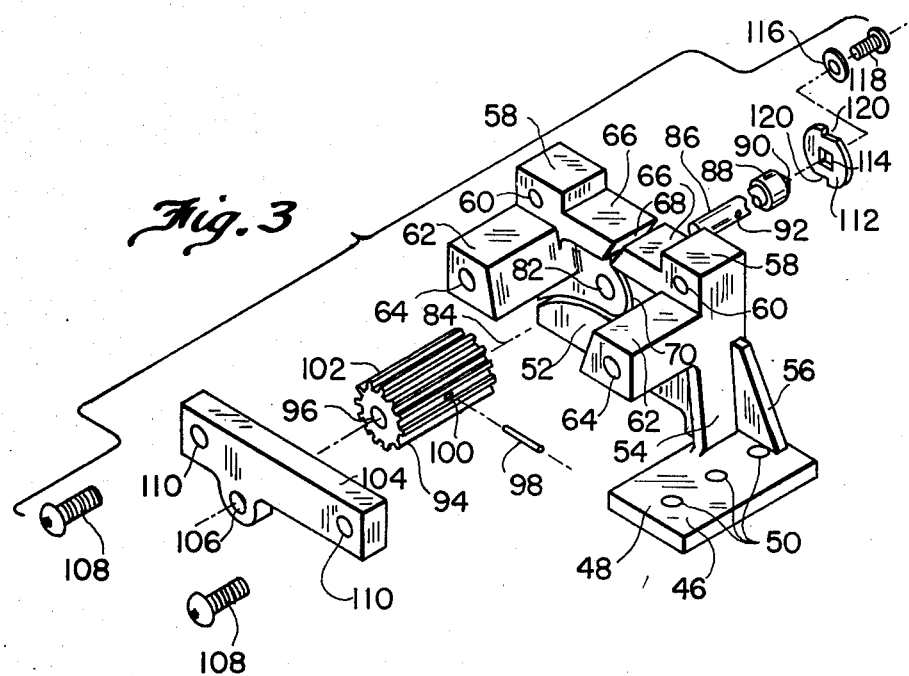
FIG. 3 is an exploded view of one-half of the feeder mechanism.

With reference to FIG. 1 of the drawings, the reference numeral 10 refers generally to a component feeder according to an embodiment of the present invention.

As shown in FIGS. 2a, 2b and 2c of the drawings, an electronic component 12 has a main body portion 14 and pair of lead wires 16 projecting outwardly from opposite ends thereof. In the operations which are carried out in the component forming machine, the lead wires 16 are cut to the required length which generally requires the removal of portions 16b from opposite ends thereof. The lead wires 16 are then formed to the required configuration for mounting on a supporting structure.

As shown in FIG. 1 of the drawings, the component feeder mechanism 10 is mounted on a component forming machine 18 which may be of a conventional type such as that manufactured by Frank Storimans Limited. Vandorf, Gormley, Ontario and identified by the trade name CF-7 or CF-7V. This device is designed to carry out the forming of the leads as described above with reference to FIGS. 2a, 2b and 2c. The leads are engaged in the teeth formed at the peripheral edge of a pair of cutter wheels 20 mounted on a shaft 22. The wheels 20 move the component past cutter blades (not shown) which cut the leads to the required length. The leads are then formed to the required configuration between bending wheels 24 and 26.

The component feeder 10 is provided with a hopper 30 into which components are fed in bulk. The components are not previously taped or carded and are separate from one another. The components are fed from the hopper 30 through zig-zag shaped passages 32 and formed in the magazine support arms 34. The body portion 12 of the component is located within the passage 36 formed between the support arms 34 with the leads 16 of the components projecting into the passages 32. The magazine support arms 34 each consist of a pair of face plates 38 which are spaced from one another by a plurality of spacers 40.

The component feeder 10 consists of two driven feeder mechanisms 42 which are of opposite hand. The feeder mechanisms 42 are identical to one another with the exception that they are of opposite hand and consequently only one such mechanism will be described in detail. The feeder mechanisms 42 are mounted on feeder blocks 44 of the component forming machine which are mounted for movement towards and away from one another so as to adjust the width of the gap 36 formed therebetween to accommodate components of different body lengths.

Figure 4:
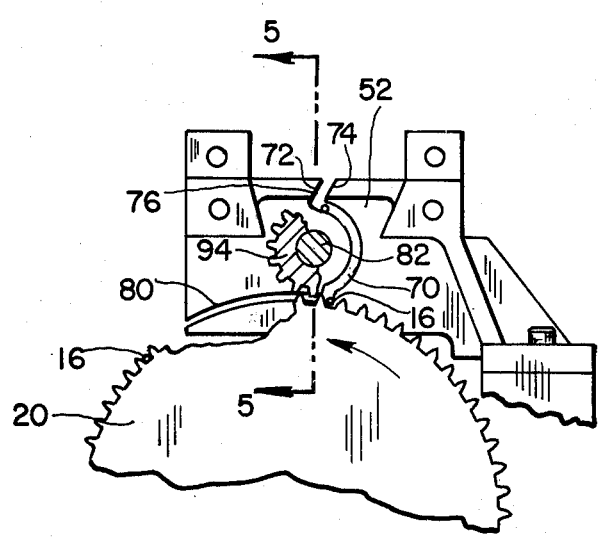
FIG. 4 is a side view of a frame illustrating a feeder wheel of the forming mechanism in phantom outline.

As shown in FIG. 3 of the drawings, the feeder mechanisms consist of a frame 46 which has a base plate portion 48 formed with a plurality of mounting holes 50 for mounting the base plate on the blocks 44. The frame 46 includes a face plate 52 which is disposed in a plane at right angles to the base plate 48. The face plate 52 is secured with respect to the base plate 48 by means of a vertical post 54 and a web 56. A pair of shoulders 58 are formed at the upper end of the face plate 52 and have threaded passages 60 opening inwardly from opposite sides thereof. The passages 60 serve to mount the face plates 38 of the feeder magazine, one on either side of the shoulders 58. A pair of arms 62 project outwardly from the shoulders 58 and are provided with threaded passages 64 at the outer ends thereof. A pair of flanges 66 project outwardly from the face plate 52. A gap 68 is formed between the flanges 66 to permit the lead wires of a component to pass therebetween. A guide track passage 70 is formed in the face plate 52. As shown in FIG. 4 of the drawings, the guide track passage 70 has an inside edge 72 and an outside edge 74. The guide track passage 70 also has an entry section 76, a spacing section 78 and an exit section 80 which are serially connected. A passage 82 opens through the face plate 52 and has a central axis 84. Shaft 86 has a shoulder portion 88 which is adapted to fit in a close fitting relationship within the passage 82. The shaft 86 also has a square shaped end projection 90. A threaded passage (not shown) opens inwardly from the end of the square shaped projection 90 and a small passage 92 opens through the main body of the shaft 86.

A longitudinally elongated gear wheel 94 is formed with a passage 96 adapted to receive the main body portion of the shaft 86 in a close fitting relationship. The gear wheel is pinned to the shaft 86 by means of a shear pin 98 adapted to project through the passage 100 in the gear 94 in the passage 92 in the shaft 86. The gear wheel 94 is formed with a plurality of longitudinally elongated slots 102 between adjacent teeth thereof. An end plate 104 is formed with a passage 106 adapted to receive the main body portion of the shaft 86 in a close fitting relationship. The end plate 104 is adapted to be mounted on the outer ends of the arms 62 by means of mounting screws 108 extending through passages 110 and threadably engaging the passages 64 of the arms 62. A spacer disc 112 has a square shaped opening 114 therein adapted to fit in a close fitting relationship about the square shaped projection 90. A washer 116 and a screw 118 serve to secure the disc 112 to the end of the shaft 86. The spacer disc 112 has a pair of notches 120 formed at the peripheral edge thereof as will be described hereinafter.

Figure 5:
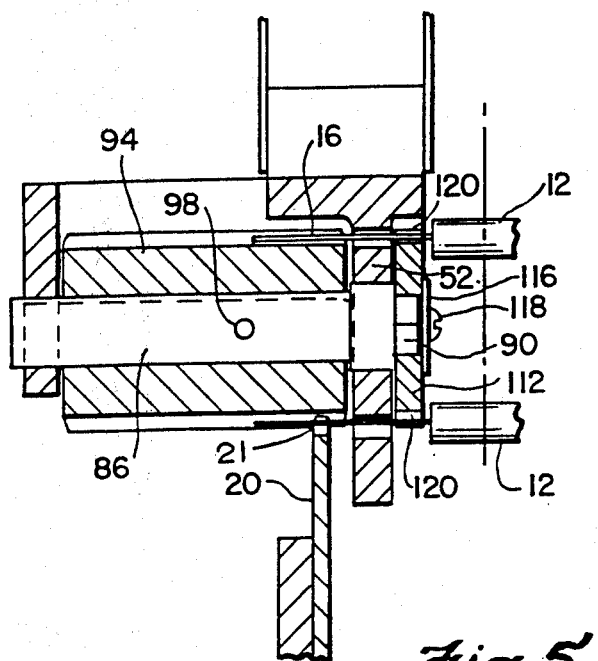
FIG. 5 is a sectional view through a portion of the assembled feeder mechanism of FIG. 3.

FIG. 5 of the drawings illustrates the manner in which the various components of FIG. 3 of the drawings are assembled. As shown in FIG. 5, the spacer disc 112 is located in a recess formed in the inner surface of the face plate 52 and is secured with respect to the shaft 86 by means of a screw 118. The inner face of the gear member 94 bears against the inner face of the face plate 52 in a close fitting sliding relationship. The lead wires 16 of the components 12 project through the notches 120 and longitudinally of the elongated slots 102 of the gear member 94 and between the teeth 21 of the wheel 20 of the forming machine. The teeth 21 of the wheel 20 drivingly engage the teeth of the gear wheel 94 to rotatably drive the gear wheel 94 and its associated shaft and spacer disc 112 in use. The teeth 21 of the wheel 20 are substantially narrower than the elongated slots 102 so that the lead wire 16 may pass from the slots 102 in the gap formed between the teeth 21 when the teeth 21 are in engagement with the teeth of the gear wheel 94 by dropping rearwardly of the tooth 21 which engages within the slot 102 in which the lead wire 16 is located.

Figure 6:
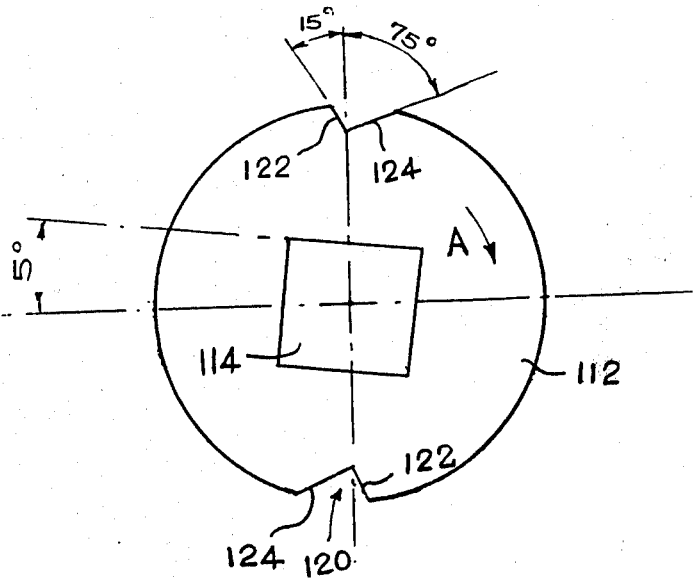
FIG. 6 is a pictorial view of a disc according to an embodiment of the present invention.

As shown in FIG. 6 of the drawings, the notches 120 which are formed in the disc 112 are disposed diametrically opposite one another. With respect to the direction of rotation A of the disc 112, each notch has a forwardly directed face 122 and a rearwardly directed face 124. The forwardly directed faces 122 extend at an angle of 15° to the radial plane extending through the inner end of the notch and the rearwardly directed faces 124 extend at an angle of 75° to the radial plane. The square opening 114 is angularly inclined 5° with respect to said radial plane to synchronize the position of the notches with respect to the grooves of the gear wheels.

Figure 7:
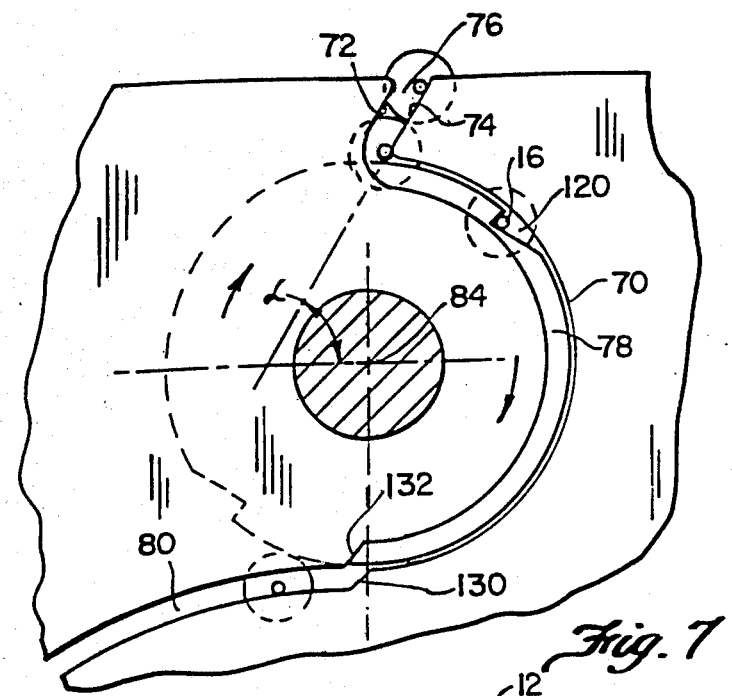
FIG. 7 is a diagrammatic illustration of the manner in which the disc moves a component lead wire along a guide track.

FIG. 7 of the drawings illustrates the form of the guide track slot in enlarged detail. As previously indicated, the guide track passage 70 has an inner face 72 and an outer face 74, an entry section 76, a spacing section 78 and an exit section 80. The entry section 76 is inclined with respect to the horizontal plane at an angle $\alpha$ which is preferably about 45°.

The spacing section 78 has an arc of curvature generated from the axis 84 with the inner face 72 located at a radius which is less than the radial distance to the base of the notches 120. The outer face 74 is located in a close fitting sliding relationship with respect to the outer edge of the disc 112. The shoulders 130 and 132 are formed at the intersection of the spacer section 78 and the exit section 80 and serve to guide the lead wire 16 downwardly out of engagement with the notches 120 into the exit section 80 and the spaces formed between adjacent teeth of the wheel 20.

Figure 8:
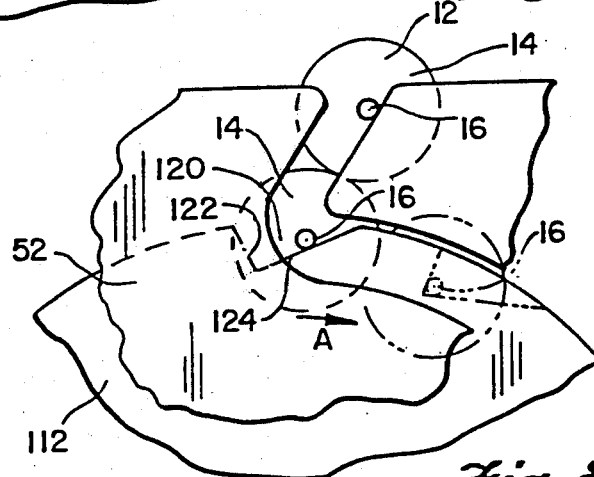
FIG. 8 is an enlarged detailed view illustrating the manner in which a component is transferred from the entry section of the track guide to the spacer section of the track guide.
Figure 9:
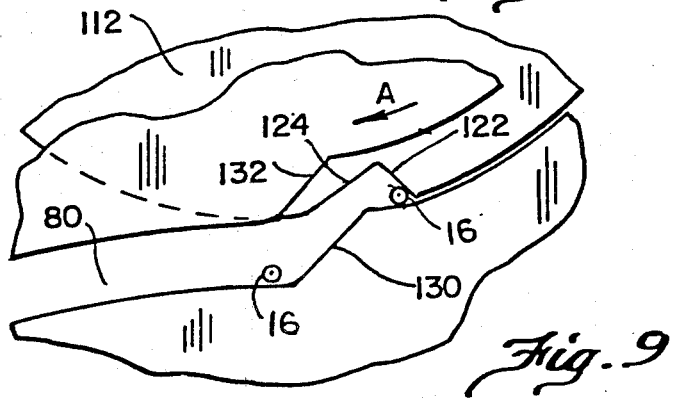
FIGS. 9 and 10 are enlarged detailed views diagrammatically illustrating the manner in which the component is transferred from a spacer section to the exit section of the guide track.
Figure 10:
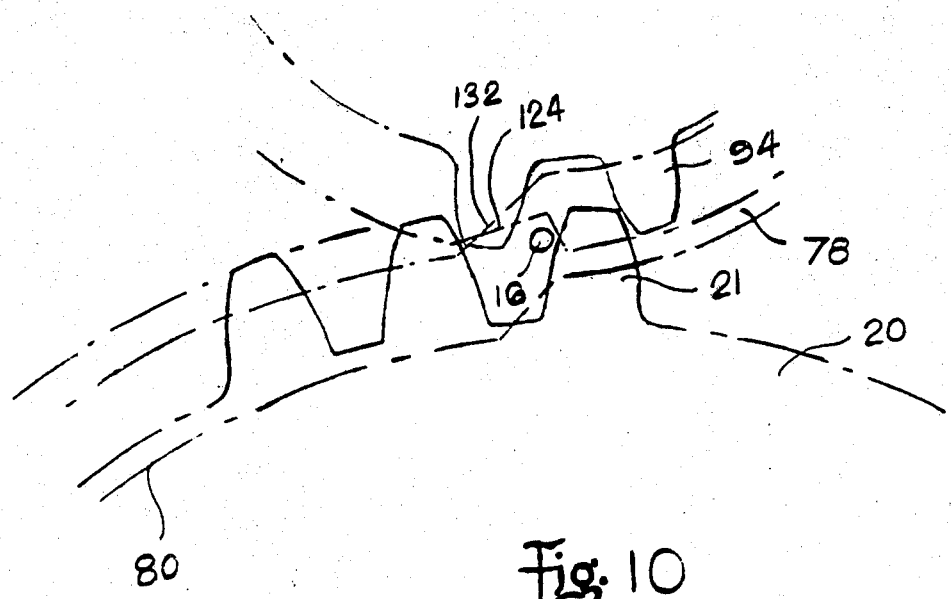

As shown in FIG. 8 of the drawings, a plurality of components 12 with their lead wire 16 located in the entry section of the guide track passage will have the lead wires spaced apart by the thickness of the body portions 14. The lead wires 16 of the first component will be engaged by the forwardly directed face 122 of the disc 112 and as shown in FIG. 7 of the drawings, rotation of the disc 112 about the axis 84 moves the lead wire along the spacer section of the guide track to space the components from one another a distance equal to the peripheral distance between the notches 120. When the first component reaches the exit section 80 of the guide track, the lead wires 16 are engaged by the shoulder 132 and directed downwardly into the exit section 80. Simultaneously, the next component is located in the other notch 120 as illustrated in FIG. 8. As the lead wires 16 are transferred from the spacer section 78 to the exit section 80, they are automatically transferred from the notch 120 into the space formed between the teeth of the gear 20. The lead wires of successive components are maintained in a spaced relationship with respect to the wheel 20 by reason of the fact that the lead wires of successive components are located between spaced apart teeth at the periphery of the wheel 20. The components are then fed through the component forming machine in the conventional manner to be cut and formed as previously described. An important feature of the present invention is the provision of the shoulder 132 which is inclined at an angle 45° to the vertical plane and which together with the shoulder 130 defines a passage which connects the space of the sections 78 from the exit section 80 of the passage formed in the spacer housing. In use, because of the speed of rotation of the spacer disc 112 the leads 16 are driven along the spacer passage by the forwardly directed face 122 of the notch and when they arrive at the shoulder 132 they are driven out of the notch by contact with the shoulder 132. The 15° rearward inclination of the face 122 permits the 45° angle face 132 to drive the leads outwardly of the notch rather than pinch the leads between the faces 132 and 122. As shown in FIG. 10 the relationship between the teeth of the wheel 94 and the teeth of the wheel 20 is such that there is a sufficient space between the teeth to permit the lead 16 to be transferred from engagement with the wheel 94 to engagement with the wheel 20.

The electronic components are located in the hopper 30 and fall one at a time under the influence of gravity through the zig-zag slot 32 to the spacer mechanism. The lead wires of the components are engaged by the spacer wheel with lead wires extending outwardly therefrom into the slots of the elongated gear wheel. The wheel 20 of the forming machine rotatably drives the elongated gear wheel 94 which in turn drives the spacer disc to move the leading component from the input section of the guide passage to the exit section and to transfer the component from engagement with the rotating disc to the wheel 20 on the forming machine. The successive components are spaced from one another by a distance equal to the circumferential distance between adjacent notches on the disc. In this manner the components are fed in a required spaced relationship to the cutting and forming machine without the aid of a tape or card holding the components in the spaced relationship.

From the aforegoing it will be apparent that the present invention provides an apparatus which permits the feeding of components to a component forming machine from a bulk supply and thereby eliminates the need for taping of the components or the mounting of the components on feeder cards.

Various modifications of the present invention will be apparent to those skilled in the art without departing from the scope of the invention. For example, the number of notches on the spacer wheel 112 may be varied depending upon the spacing required between the transferred components. In addition the components may be fed into the entry section by a magazine which permits card mounted components to be stored therein. These and other modifications of the present invention will be apparent to those skilled in the art.

These and other advantages of the present invention will be apparent from the foregoing specification.

What I claim as my invention is:

1. A component feeder for feeding electrical components, of the type having a main body portion and wire leads projecting from opposite ends thereof, to a component forming machine or the like comprising
   a. a frame having a pair of guide walls spaced from one another a distance sufficient to permit the body portion of a component to pass therebetween,
   b. guide track means extending through each of said guide walls for receiving and guiding the leads of the components as they pass through the frame, each of said guide track means having an inside edge and an outside edge and a serially connected entry section, spacing section and exit section,
   c. spacer disc means rotatably mounted in said frame for rotation about its axis with a portion of its marginal edge overlying said spacing section of said guide track,
   d. transmission means for driving said spacer disc means in a synchronized relationship with respect to said component forming machine,
   e. notch means in said marginal edge of said spacer disc, said notch means having a depth to overlie said spacing section of said guide track means as it passes thereover, said notch means having a forwardly directed face and a rearwardly directed face with respect to the direction of rotation of said disc, said notch means being adapted to permit transfer of a lead wire from said entry section to said spacing section of said guide track means when said notch is aligned with said entry section, said forwardly directed face being adapted to drive a lead wire of a component along said track means in response to rotation of said disc,
   f. said inside edge of said spacing section having an ejection shoulder adapted to force a lead wire out of the notch which carries it to transfer the lead wire and its associated main body portion to said exit section for engagement with a feeder wheel of said component forming machine or the like in a spaced relationship with respect to a subsequently delivered component.

2. A component feeder as claimed in claim 1 wherein a plurality of peripherally spaced notches are formed in each spacer disc such that a plurality of components are transferred on each rotation of said disc.

3. A component feeder as claimed in claim 1 wherein said spacing section of said guide track means consists of an arcuate groove generated from the axis of rotation of said spacer disc and underlying a portion of the peripheral edge of the disc, said entry section consisting of a slot which is inclined upwardly from said spacer section in a direction of rotation of said disc and said exit section having an arcuate curvature corresponding to the arcuate curvature of the feeder wheel of the component forming machine into which the components are fed.

4. A component feeder as claimed in claim 1 including hopper means for delivering components one at a time to said entry section of said guide track means.

5. A component feeder as claimed in claim 1 wherein said transmission means includes a pair of elongated gear members meshed one with each cutter wheel of the forming machine, said elongated gear members permitting lateral adjustment of said cutter wheel to cut leads to various lengths.

6. A component feeder as claimed in claim 1 wherein each of said spacer discs is formed with two notches which are 180° removed from one another.

7. A component feeder as claimed in claim 1 wherein said walls of said frame are mounted for movement towards and away from one another to permit components of different main body lengths to pass therebetween.

* * * * *